(12) United States Patent
Vats et al.

(10) Patent No.: US 11,401,607 B2
(45) Date of Patent: Aug. 2, 2022

(54) TISIN COATING METHOD

(71) Applicant: EUGENUS, INC., San Jose, CA (US)

(72) Inventors: Vinayak Veer Vats, San Ramon, CA (US); M. Ziaul Karim, San Jose, CA (US); Bo Seon Choi, Youngin-Si (KR)

(73) Assignee: Eugenus, Inc., San Jose, CA (US)

( * ) Notice: Subject to any disclaimer, the term of this patent is extended or adjusted under 35 U.S.C. 154(b) by 290 days.

(21) Appl. No.: 15/612,853

(22) Filed: Jun. 2, 2017

(65) Prior Publication Data

US 2018/0347040 A1 Dec. 6, 2018

(51) Int. Cl.
*C23C 16/455* (2006.01)
*C23C 16/34* (2006.01)

(52) U.S. Cl.
CPC ........ *C23C 16/45531* (2013.01); *C23C 16/34* (2013.01); *C23C 16/45565* (2013.01)

(58) Field of Classification Search
CPC ........ C23C 16/45531; C23C 16/45565; C23C 16/34
USPC ........................................... 427/248.1–255.7
See application file for complete search history.

(56) References Cited

U.S. PATENT DOCUMENTS

| | | | | |
|---|---|---|---|---|
| 6,911,391 B2 * | 6/2005 | Yang | ....................... | C23C 16/06 438/653 |
| 9,099,473 B2 | 8/2015 | Kim et al. | | |
| 9,159,608 B2 | 10/2015 | Park et al. | | |
| 2004/0115930 A1 * | 6/2004 | Lee | .................. | H01L 21/76843 438/658 |
| 2009/0111264 A1 | 4/2009 | Yang et al. | | |
| 2010/0102417 A1 * | 4/2010 | Ganguli | .................. | C23C 16/34 257/532 |
| 2015/0050806 A1 | 2/2015 | Park et al. | | |
| 2015/0206756 A1 * | 7/2015 | Gandikota | ........ | H01L 21/28061 438/593 |
| 2015/0279683 A1 | 10/2015 | Harada | | |
| 2018/0350657 A1 | 12/2018 | Vats et al. | | |

FOREIGN PATENT DOCUMENTS

| | | |
|---|---|---|
| JP | 2015-193878 | 11/2015 |
| KR | 10-2003-0003322 | 1/2003 |

OTHER PUBLICATIONS

International Search Report and Written Opinion dated Sep. 21, 2018 in corresponding PCT Application No. PCT/US2018/035470; 10 pages.

* cited by examiner

*Primary Examiner* — Michael B Cleveland
*Assistant Examiner* — Michael G Miller
(74) *Attorney, Agent, or Firm* — Knobbe, Martens, Olson & Bear, LLP

(57) ABSTRACT

A method for ALD coating of a substrate with a layer containing Ti, Si, N, wherein a reaction gas and then a flushing gas are introduced into a process chamber holding the substrate in a plurality of successive steps, each in one or more cycles, wherein TiN is deposited in a first step with a reaction gas containing Ti and a reaction gas containing N, TiSi is deposited in a second step with a reaction gas containing Ti and a reaction gas containing Si, and in a third step following the second step, TiSiN is deposited with a reaction gas containing Ti, with a reaction gas containing N and with a reaction gas containing Si.

20 Claims, 2 Drawing Sheets

TISIN COATING METHOD

FIELD OF THE INVENTION

The invention relates to a method for ALD coating of a substrate with a layer containing Ti, Si, N.

BACKGROUND

In the ALD method, a layer consisting of a plurality of chemical elements is deposited on a substrate in several successive cycles. Reaction gases containing at least one element that is to be deposited in the layer are used in this process. In these cycles, layers of the same elements or a group of elements are deposited, layer for layer, a reaction gas being introduced into the process chamber in each case and remaining there in the process chamber until the surface of the substrate has become saturated with the reaction gas. In a subsequent Flush or purge step, the residues of the process gas are removed from the process chamber and the same reaction gas or another reaction gas is introduced into the process chamber. The deposition process takes place at elevated temperatures at which a chemical reaction takes place on the substrate surface; in particular a decomposition reaction of the reaction gas may take place on the substrate surface. Volatile reaction products are removed from the process chamber with the flushing gas.

The aforementioned document discloses a method for deposition of a diffusion barrier on a layer sequence of an electronic component, for example, a memory component made on silicon substrates, wherein the layer not only serves to limit diffusion but should also be electrically conductive in order to be used as a contact. In a first step a TiN layer is deposited there and then an SiN layer is deposited. The individual cycles are carried out several times one after the other in such a way that a TiSiN layer is formed on the whole.

The diffusion resistance of the layer can be increased by increasing the silicon content. When the silicon content is increased in the known process, the electric resistance of the deposited layer increases at the same time, so that the properties of the layer are inferior if it should act as a contact layer.

US 2015/0279683 and U.S. Pat. No. 6,911,391 also relate to a method for deposition of TiSiN layers on substrates.

Such a method is described in US 2015/0050806 A1.

SUMMARY OF THE INVENTION

The object of the invention is to provide measures with which a diffusion barrier is increased with regard to its diffusion resistance but at the same time the electric conductivity is not impaired.

This object is achieved by the invention defined in the claims, wherein the dependent claims are not just advantageous refinement of the method defined in the independent claim but also constitute independent approaches to solving the problem, wherein individual subfeatures of the independent claims also have independent inventive significance.

First and essentially, it is proposed that after an obligatory heating step following transport of the substrate into the process chamber, TiN is deposited on the substrate and/or on a layer already deposited on the substrate, in particular a polysilicon layer. Next, an N-free layer or layer sequence of Ti and Si is deposited. Then a TiSiN layer or layer sequence is deposited on the TiS layer. This takes place in three chronologically successive steps, each step being carried out at least once, preferably at least one of these steps or all of these steps being carried out several times in succession. In the first step, a cycle is carried out n times for deposition of TiN, first injecting a reaction gas that contains titanium into the process chamber, then flushing the process chamber with an inert gas, next containing a reaction gas containing nitrogen into the process chamber and finally flushing the process chamber with an inert gas. Nitrogen or argon or some other suitable noble gas or any other suitable gas may be used as the inert gas; n may be 1 but is preferably at least 5. The second step may consist of two substeps, each of which is carried out at least once, but preferably is carried out multiple times. In the first substep a reaction gas containing titanium is injected into the process chamber and then the process chamber is flushed with an inert gas. The first substep may be carried out m times, where m=1, but preferably is at least 5. In the second substep a reaction gas containing silicon is first injected into the process chamber and then the process chamber is flushed with an inert gas. This second substep may be carried out k times, where k=1, but is preferably at least 5. The second step, in which a nitrogen-free area of the coating is essentially preferably deposited, is carried out r times, where r=1, but is preferably at least 10. The third step preferably also consists of two substeps, wherein TiN is deposited in a first substep. To do so, essentially the first step described above is carried out p times. In the first substep of the third step, a reaction gas containing titanium is first injected into the process chamber, then the process chamber is flushed with an inert gas. Next a reaction gas containing nitrogen is injected into the process chamber and then the process chamber is flushed with an inert gas. This first substep of the third step is carried out p times, where p=1, but is preferably at least 2. In the first substep of the third step, a reaction gas containing titanium is first injected into the process chamber. The process chamber is then flushed with an inert gas. Next, a reaction gas containing nitrogen is injected into the process chamber and then the process chamber is flushed with an inert gas. In the first substep of the third step, the coating thus includes an area containing nitrogen. A second substep and in particular the last substep, in which only silicon is deposited by injecting a reaction gas that contains silicon into the process chamber is carried out following the first substep, wherein, here again, a cycle consisting of injecting the reaction gas containing silicon into the process chamber and then flushing the process chamber with the inert gas is carried out q times, where q=1 or preferably is at least 5. The third step, in which TiSiN is deposited on the whole, can be carried out r times, where r=1 but preferably is at least 10. It is provided in particular that in carrying out the third step, the reaction gas of the last substep does not contain any nitrogen. As a result of the method according to the invention, an area containing TiN, i.e., having Ti-N bonds, is deposited on the layer of the substrate containing silicon in the first step due to the method according to the invention. A second area, which is a core area in which essentially Si-Si bonds or Si-Ti bonds are formed, is deposited on this first area which is a borderline report [sic; area]. These bonds have a much lower bond energy (approximately 100 eV) than the Ti-N bond in which the bond energy is approximately 450 eV. This method is carried out in particular in such a way that $TiSi_2$ is formed in different phases and has a lower electrical resistance than TiSiN, for example. To this extent, it is advantageous if an N-free component is deposited in the last substep of the third step, wherein the reaction gas does not contain any nitrogen component for this purpose which does not take part in the chemical reaction although $N_2$ can. In the last step a third area of the coating is deposited, this being a borderline region containing nitrogen. The individual layer thicknesses of the three layers are preferably 2 Å to 200 Å with the sum total of the three layers being 5 Å to 500 Å. All three layers could be repeated insitu and in sequence to yield film thicknesses of 5 Å to 500 Å. The gaseous compounds of titanium, silicon and nitrogen known from the prior art, for example, $TiCl_4$, TDMAT or TDEAT are used as the reaction gases. Dichlorosilane ($SiH_2Cl_2$) or $SiHCl_3$, $SiCl_4$, $SiH_4$ or $Si_2H_6$ may be used for the reaction gas containing silicon. $NH_3$ or MMH may be used as the reaction gas containing nitrogen. This method begins with heating of the substrate to a temperature of 400° C. to 700° C. at a total pressure in the range between 5 millibar and 0.6 millibar (Equivalent to 0.5 mtorr to 7.5 mTorr). Next the three steps described above are carried out. After cooling the substrate, it is removed from the process chamber. The term substrate as used here in particular is understood to refer to a prestructured and precoated wafer on which a structured silicon-containing layer sequence has already been deposited, for example, a layer sequence of a memory module. The TiSiN coating deposited according to the invention can then be connected by means of wires made of copper or the like.

The coating is preferably deposited in a reactor that can be evacuated using a vacuum system. Inside the reactor there is a gas inlet element for introducing the reaction gases and/or the inert gas. The gas inlet element may be in the form of a shower head. It may have a plurality of sectors or segments, wherein the segments or sectors form separate chambers into which the reaction gas containing Ti, the reaction gas containing Si or the reaction gas containing N can be injected separately from one another. The gas inlet element may extend over the total area extent of the substrate which sits on a heated susceptor. The gas inlet element may be cooled but it may also be heated. The substrate is preferably sitting on a susceptor which may be heated by a plurality of heating element so that the susceptor has a plurality of heating zones which may be heated independently of one another. A uniform temperature profile can be adjusted on the substrate surface in this way. In particular, a temperature profile with a minimal lateral temperature gradient can be adjusted on the substrate surface.

In addition, the invention relates to a coating applied to a substrate and having a first borderline region with which the coating is adjacent to the substrate or to a layer applied to the substrate. The coating also has a second borderline region which is opposite the first borderline region and to which a metallic or metal ceramic contact is applied. The second borderline region has a surface area, which comes in contact with the contact material. Between the first borderline region and the second borderline region there is a core region. The inventive coating has the following properties: the first borderline region has a higher nitrogen concentration than the core region. The second borderline region has a higher nitrogen concentration than the core region. The core region is preferably free of nitrogen. The surface area of the second borderline region is preferably free of nitrogen.

BRIEF DESCRIPTION OF THE DRAWINGS

The invention is explained in greater detail below on the basis of exemplary embodiments, in which.

DESCRIPTION OF THE EMBODIMENTS

Figure 2:
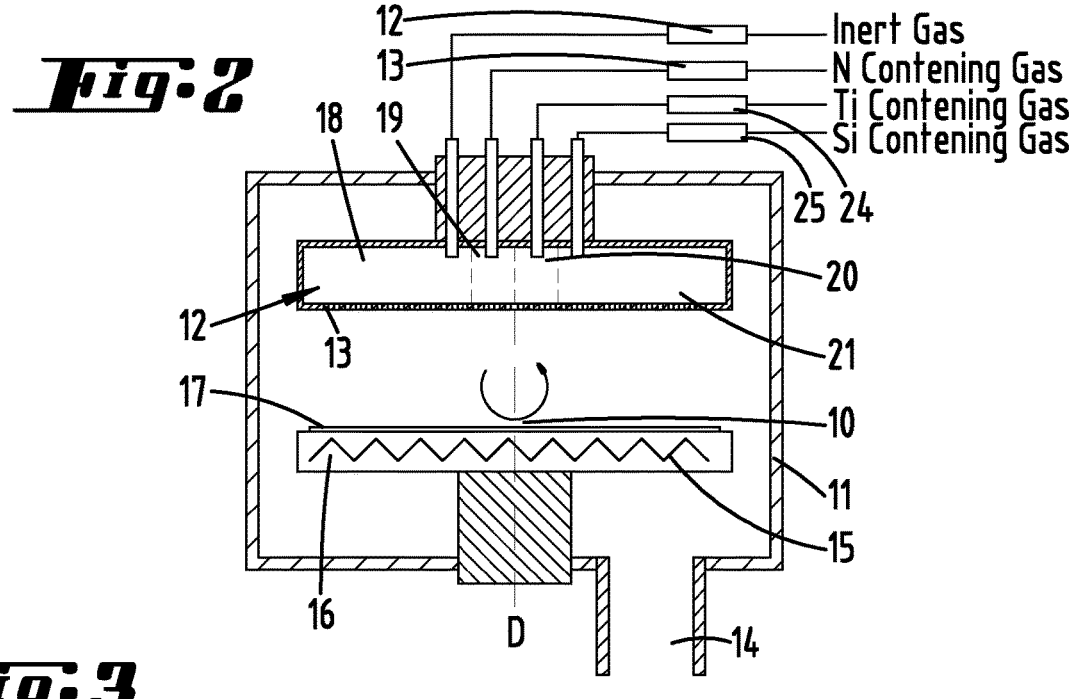
FIG. 2 shows schematically the structure of a reactor for carrying out the process in a type of cross section and FIG. 3 shows the cross section through a gas inlet element of a device illustrated in FIG. 2.

FIG. 2 shows schematically the structure of a coating device arranged inside a reactor housing 11 that is sealed airtight. A plurality of inlet lines is provided, such that it is possible to feed a gas stream into a gas inlet element 12 through each of these feeder lines. The gas inlet element 12 has a plurality of gas outlet openings 13 through which the gas fed into the gas inlet element 12 can enter a process chamber 10. The bottom of the process chamber 10 is formed by the top side of a susceptor 16 on which the substrate 17 to be coated sits. The susceptor 16 can be heated to a process temperature by means of a heater 15. The susceptor 16 may be rotated about an axis of rotation D in its plane of extent. The rotation takes place relative to the gas inlet element 12. A gas outlet 14 to which a vacuum pump is connected is provided.

An inert gas can be fed into a chamber 18 of the gas inlet element 12 through a feeder line by means of a first mass flow controller 22. A gas containing nitrogen can be fed by means of a mass flow controller 23 into a chamber 19 separated from the former by an airtight seal. A gas containing titanium can be fed into a chamber 20 separated from the former with an airtight seal, by means of a mass flow controller 24. A gas containing silicon can be fed into a chamber 21 of the gas inlet element 12 by means of a mass flow controller 25.

Figure 3:
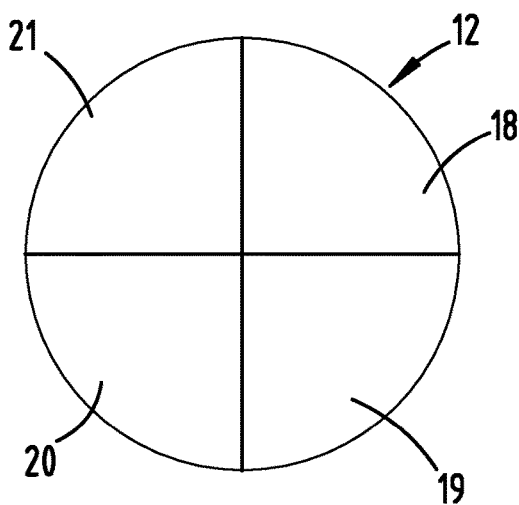

FIG. 3 shows as an example the spatial arrangement of the individual chambers 18, 19, 20, 21 in the gas inlet element 12. The chambers may be arranged like spokes. When the substrate 17 is rotated relative to the gas inlet element 12, the reaction gas or inert gas fed into the process chamber 10 comes in contact with all regions of the surface of the substrate 17.

Semiconductor components for memory element or the like have electrically active layers containing silicon. These layers must be electrically contactable in order to connect the layers to bond wires, for example. A TiSiN coating is applied between the contact and the layer, the process of application of this layer being designed so that the layer has the lowest possible electrical resistance while at the same time forming a high diffusion barrier which prevents the contact metal applied to the TiSiN coating from diffusing into the silicon layer. For deposition of this layer, an ALD method (atomic layer deposition) is used according to the invention. In this method, a reaction gas is fed into the process chamber 10 in alternation with an insert gas for flushing the process chamber 10. This takes place by introducing the respective gas into the cavity in the gas inlet element 12 and discharge the gas from the plurality of gas outlet openings 13 arranged like a sieve into the process chamber 10. The reaction gas is fed into the process chamber 10 in such a concentration and over such a period of time until the surface of the substrate 17 applied to the susceptor 16 has become saturated with the reaction gas and/or a reaction product of the reaction gas, for example, a decomposition product. Then the gas residues are flushed out of the process chamber 10. This is accomplished by introducing an inert gas into the process chamber 10, wherein the inert gas may be nitrogen or a noble gas.

According to the invention the coating is applied in a number of successive coating steps, each of which may in turn comprise substeps and is preferably repeated several times. The process is carried out in such a way that essentially Si—Si bonds or Si—Ti bonds are formed in the core area of the coating so that the coating consists mostly of TiSi$_2$ which has a lower electrical resistance than TiSiN. On the other hand, however, the process is carried out in such a way that the interface facing underneath layer and the interface of the coating having the subsequent layer have a higher nitrogen content than the core region of the coating. The coating consists essentially of three regions, a lower interface connected to the substrate surface and/or the layer containing the silicon there, said interface consisting essentially of TiN, the core region of the coating consisting essentially of Ti and Si and an upper interface consisting essentially of TiSiN.

Figure 1:
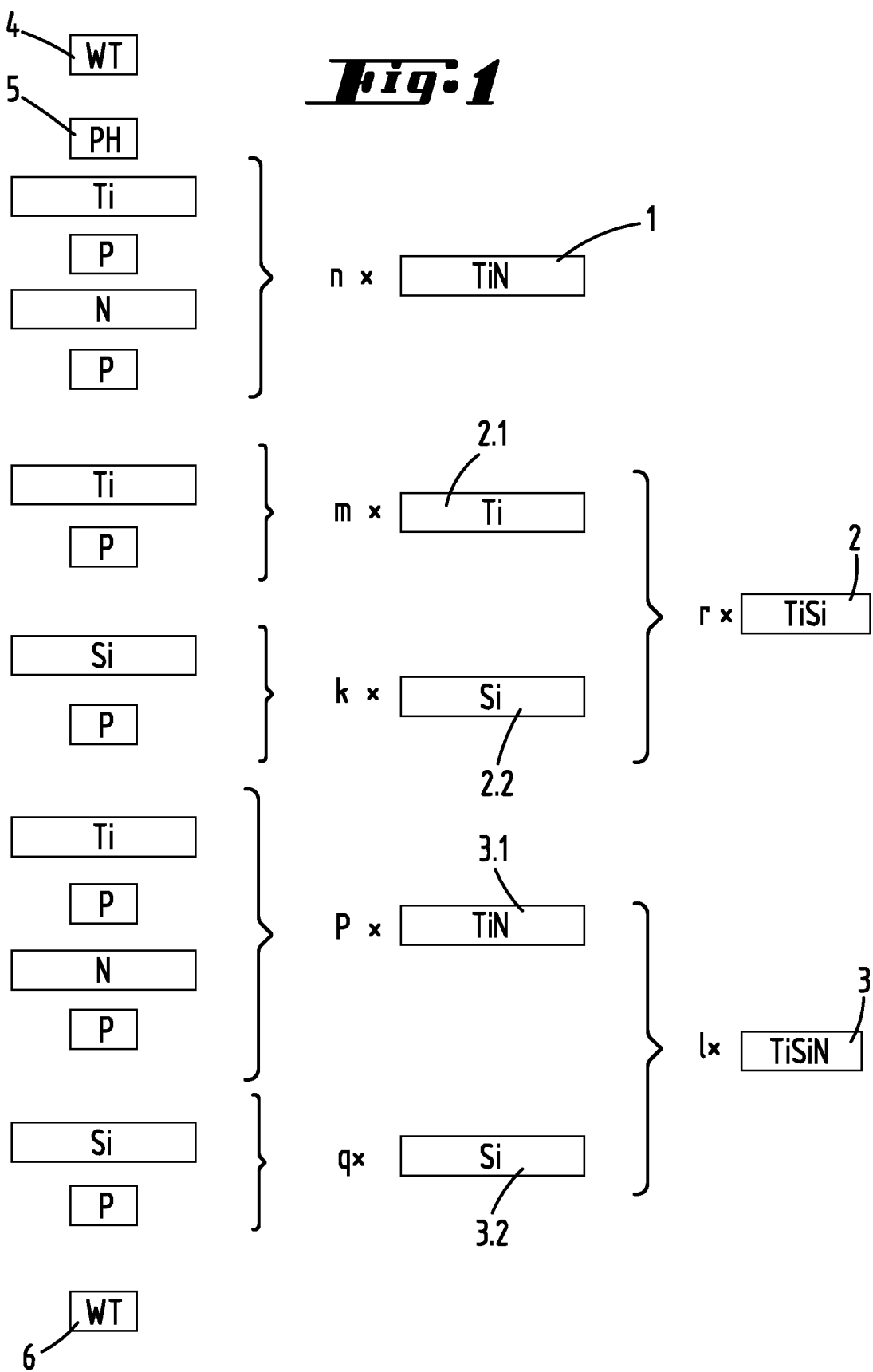
FIG. 1 shows the process steps in chronological succession as a block diagram.

The conduct of the process is explained in greater detail below with reference to the accompanying FIG. 1. First, in a substrate transport step (wafer transport) 4, the substrate 17 is introduced into the process chamber 10 where the substrate 17 rests on the susceptor 16. By heating the susceptor 16 with a heater 15 having a plurality of heating zones, the substrate is heated to a process temperature. This takes place by passing an electric current through a wire resistor of the heater 15.

In a first process step 1, TiN is deposited. To do so, a reaction gas containing Ti is first introduced into the process chamber 10 until the surface of the substrate 17 is saturated with the process gas (Ti). Then residues of the reaction gas containing Ti or its reaction products which do not remain on the surface of the substrate 17 are flushed out of the process chamber 10 by means of an inert gas (P). Next a reaction gas containing nitrogen is fed into the process chamber until the surface of the substrate 17 has been saturated with it (N). Next by introducing the inert gas, the reaction gas containing nitrogen is flushed out of the process chamber 10 (P). These four successive sequences form a first step 1 that is repeater n times resulting in a layer preferably 10 A thick but up to 50 nm thick.

In a second following step 2 the TiSi core material is deposited. This second step 2 consists of two substeps 2.1, 2.2, wherein Ti is deposited in the first substep and Si is deposited in the second substep. In the first substep 2.1, a reaction gas containing Ti is first introduced into the process chamber 10 a total of m times and then gas residues are flushed out of the process chamber 10 by introducing an inert gas (P). Following this first substep 2.1 of the second step 2 which is carried out at least once but preferably several times, the second substep 2.2 is performed. In this second substep 2.2, a reaction gas containing silicon is first fed into the process chamber 10 (Si) and then the process chamber 10 is flushed by introducing an inert gas (P). The second substep 2.2 is carried out a total of k times, where k is preferably greater than 1.

The second step 2 consisting of the two substeps 2.1 and 2.2 is preferably carried out a total of r times until the required layer thickness of a core layer, which consists of TiSi and is essentially free of nitrogen is deposited, this layer thickness may also be preferably 10 A thick but up to 50 nm.

The second step 2 is followed by a third step 3 in which TiSiN is deposited. The third step consists of two substeps 3.1, 3.2 which follow one another and can be carried out a total of l times where l is 1 or preferably greater than 1.

The first substep 3.1 of the third step 3 corresponds essentially to the first step 1. TiN is deposited, so a reaction gas containing titanium is first fed into the process chamber 10 (Ti), which is then flushed by introducing an inert gas (P). Following that a reaction gas containing nitrogen is introduced into the process chamber 10 (N) whereupon the process chamber 10 is again flushed by introducing an inert gas (P). The substep 3.1 can be carried out a total of p times where p=1 or is preferably greater than 1.

The second substep 3.2 of the third step 3 is carried out without the use of a reaction gas containing N. First the reaction gas containing silicon is fed into the process chamber 10 (Si). Then the process chamber 10 is flushed by introducing the inert gas (P), whereupon the second substep 3.2 of the third step 3 can be carried out a total of q times where q=1 or is preferably greater than 1.

After cooling the process chamber 10, the substrate 17 is removed from the process chamber 10 in a transport step (wafer transport) 4.

The gases mentioned in the introduction are used as the reaction gases, for example, the reaction gas containing Ti may be TiCl$_4$, TDMAT or TDEAT and the reaction gas containing Si may be SiH$_2$Cl$_2$, SiHCl$_3$, SiCl$_4$, SiH$_4$ or Si$_2$H$_6$. The reaction gas containing N may be NH$_3$ or MMH. The inert gas may be N$_2$ or a noble gas.

Due to the use of a gas inlet element 12 having chambers 18, 19, 20, 21 arranged like sectors around a center, a uniform flow pattern can be achieved within the process chamber. The gas inlet element 12 which is in the form of a shower head can be cooled or heated. A thermal equilibrium can be established. The susceptor 16 may also be heated or cooled. The heater 15 is in particular a multizone heater, preferably two heaters being at different distances radially from the center are arranged around the center. The chambers 19 to 21 may each be flushed with the inert gas in the respective gas change so that no reaction gas remains there.

By means of SiN measurements or XPS measurements, it has been shown that the bonding energy between the individual atoms is much lower in the core region of the layer than in the two interfaces, thus indicating that TiSiN is formed only in the boundary regions and essentially Si—Si and/or Si—Ti is formed in the core region.

Figure 4:
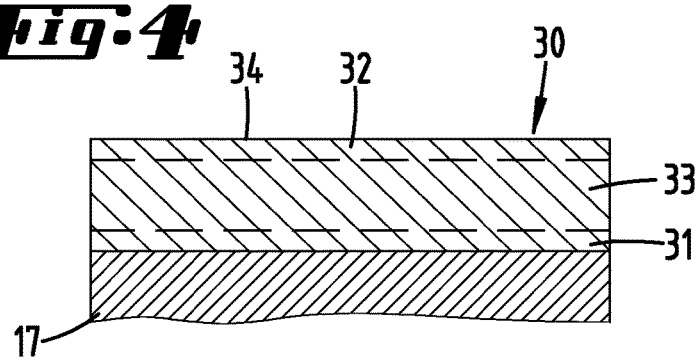
FIG. 4 shows schematically and on an enlarged scale a layer deposited by the method according to the invention on a substrate 17.

FIG. 4 shows schematically a section through a coating 30 deposited on a substrate 17. The substrate 17 is shown only symbolically and includes a silicon wafer with a layer structure deposited on it, wherein the interface of the substrate 17 facing the coating 30 may be a surface of a layer containing silicon.

The coating 30 consists of a first boundary region 31, which is deposited directly on the surface of the substrate 17, a core region 33, which is connected to the first boundary region 31 and a second boundary region 32, which has a surface 34 to which a contact wire can be connected.

The layer 30 deposited with the method described previously has a first interface 31, which has an elevated nitrogen concentration, wherein the nitrogen concentration in the first boundary region 31 is greater than that in the core region 33. The core region 33 is preferably essentially free of nitrogen. The second boundary region 32 has a higher nitrogen concentration than the core region 33. The surface 34 is preferably free of nitrogen.

In the first boundary region 31 and in the second boundary region 32, TiSiN compounds with a high bond energy are formed (TiN 455.6 eV). In the core region 33 essentially Si—Si bonds with a bond energy of 99.6 eV and Ti—Si bonds are formed. The coating 30 deposited by the method according to the invention has a high electrical conductivity and forms a high diffusion barrier. It has an essentially crystalline property and a layer thickness of approximately 0.65 nm to 650 nm.

The preceding discussion serves to illustrate the inventions covered by the patent application as a whole, each also independently improving upon the prior art at least through the following combinations of features, wherein two, more or all of these combinations of features may also be combined further, namely:

A method for ALD coating of a substrate 17 with a layer containing Ti, Si, N, wherein a reaction gas is fed into a process chamber 10 containing the substrate 17 in a plurality of successive steps 1, 2, 3 in one or more n, m, k, l, p, q, r cycles and then a flushing gas is fed into the same process chamber,
  wherein TiN is deposited in a first step 1 with a reaction gas containing TI and with a reaction gas containing N,
  in a second step 2 which follows the former step, TiSi is deposited with a reaction gas containing Ti and a reaction gas containing Si,
  and in a third step 3 following the second step 2, TiSiN is deposited with a reaction gas containing Ti, with a reaction gas containing N and with a reaction gas containing Si is deposited.

A method which is characterized in that a cycle consisting of introducing the reaction gas containing Ti, flushing the process chamber 10 with an inert gas, feeding the reaction gas containing N and flushing the process chamber 10 with a reaction gas is carried n times in the first step 1, where n>1.

A method which is characterized in that in the second step 2 a first substep 2.1 consisting of introducing the reaction gas containing Ti and then flushing the process chamber 10 with an inert gas is carried out m times, where m>1 and in which a second substep 2.2 in which the reaction gas containing Si is introduced into the process chamber 10 and then the process chamber 10 is flushed with the inert gas, is carried out k times where k>1.

A method which is characterized in that the two substeps 2.1, 2.2 are carried out l times in succession where l>1.

A method which is characterized in that in the third step 3 a first substep 3.1, in which the reaction gas containing Ti is introduced into the process chamber 10 and then the process chamber 10 is flushed with an inert gas, next the reaction gas containing N is introduced into the process chamber 10 and then the process chamber 10 is flushed with an inert gas is carried out p times where p>1, and in a second substep 3.2 the process gas containing Si is fed into the process chamber 10 and next the process chamber 10 is flushed with an inert gas wherein the second substep 3.2 is carried out q times in succession, where q>1.

A method which is characterized in that the third step 3 is carried out r times in succession where r>1.

A method which is characterized in that the reaction gas containing Ti is introduced at a partial pressure of less than $12 \times 10^{-3}$ millibar; the reaction gas containing Si and having a partial pressure between $1 \times 10^{-3}$ and $4 \times 10^{-3}$ millibar is introduced and/or the reaction gas containing N is introduced at a partial pressure between $9 \times 10^{-3}$ and $8 \times 10^{-1}$ millibar.

A method that is characterized in that the total pressure inside the process chamber 10 is in the range between 0.6 and 6 millibar and the steps 1, 2, 3 are carried out at temperatures in the range between 400 and 700° C., wherein the times for feeding the reaction gases are in the range between 0.4 and 60 seconds.

A method which is characterized in that the reaction gas containing Ti is $TiCl_4$, TDMAT or TDEAT and/or the reaction gas containing Si is $SiH_2Cl_2$, $SiHCl_3$, $SiCl_4$, $SiH_4$ or $Si_2H_6$ and/or the reaction gas containing N is $NH_3$ or MMH.

A coating which is characterized in that the nitrogen content in the first and second boundary ranges 31, 32 is greater than that in the core region 33.

A coating which is characterized in that the core region 33 is essentially free of nitrogen.

A coating which is characterized in that the surface 34 of the second boundary region facing away from the substrate 17 is free of nitrogen.

All the features disclosed here are essential to the invention (either alone or in combination with one another). Thus, the full disclosure content of the respective/attached priority documents (photocopy of the previous patent application) has also been included for the purpose of incorporating features of these documents into the claims in the present patent application). The dependent claims characterized with their features independent inventive refinements of the prior art even without the features of a claim that has been included by way of reference, in particular to compile divisional applications on the basis of these claims. The invention defined in each claim may additionally have one or more of the features defined in the preceding description, in particular features provided with reference numerals and/or cited in the list of reference numerals. The invention also relates to design forms in which individual features of those cited in the preceding description are not implemented, in particular inasmuch as they are recognizably not essential for the respective intended purpose or can be replaced by other means having the same technical effect.

LIST OF REFERENCE NUMERALS

1 Process step
2 Process step
2.1 Substep
2.2 Substep
3 Process step
3.1 Substep
3.2 Substep
4 Transport step
5 Heating step
6 Transport step
10 Process chamber
11 Reactor housing
12 Gas inlet element
13 Gas outlet opening
14 Gas outlet
15 Heater
16 Susceptor
17 Substrate
18 Chamber
19 Chamber
29 Chamber
21 Chamber
22 Mass flow controller
23 Mass flow controller
24 Mass flow controller
25 Mass flow controller
30 Coating
31 Boundary region
32 Boundary region
33 Core region
34 Surface
D Axis of rotation
k Cycle number
l Cycle number
m Cycle number
n Cycle number
p Cycle number
q Cycle number
r Cycle number

What is claimed is:

1. A method of coating a substrate, the method comprising:
    depositing a layer comprising Ti, Si and N by introducing a precursor gas and a flushing gas into a process chamber holding the substrate in a plurality of steps, wherein each of the steps is performed in one or more cycles at a temperature that causes a decomposition reaction at a substrate surface between sequentially introduced precursors, wherein the steps comprise:
    providing the substrate having a silicon surface,
    depositing TiN directly on the silicon surface in a first step with a first Ti precursor gas and a first N precursor gas such that the TiN contacts the silicon surface,
    in a second step directly following the first step, depositing TiSi in a second step with a second Ti precursor gas and a first Si precursor gas, and
    in a third step directly following the second step, depositing TiSiN with a third Ti precursor gas, a second N precursor gas and a second Si precursor gas,
    such that the TiSi has a lower electrical resistance than the TiSiN and is directly interposed between and contacts the TiN and the TiSiN,
    wherein depositing the TiSiN comprises depositing a TiN sublayer using the third Ti precursor gas and the second N precursor gas, followed by flushing the process chamber with an inert gas, followed by depositing a discrete Si sublayer on the TiN sublayer using the second Si precursor gas, and
    wherein depositing the Si sublayer in the third step is the final step of the method of coating the substrate and is performed by exposing the substrate to the second Si precursor a plurality of times without exposing the substrate to any other N precursor gas to form the discrete Si sublayer such that a top surface of the layer is free of nitrogen.

2. The method according to claim, 1, wherein a cycle comprising introducing the first Ti precursor gas, flushing the process chamber with an inert gas, introducing the first N precursor gas and flushing the process chamber with the inert gas is carried out n times, where n>1 in the first step.

3. The method according to claim 1, wherein a first substep of the second step comprising introducing the second Ti precursor gas and then flushing the process chamber with an inert gas is carried out m times, where m>1, and in which a second substep of the second step in which the first Si precursor gas is introduced into the process chamber and then the process chamber is flushed with the inert gas, is carried out k times, where k>1.

4. The method according to claim 3, wherein the first and second sub steps of the second step are carried out L times in succession in the second step where L>1.

5. The method according to claim 1, wherein a first substep of the third step in which the third Ti precursor gas is introduced into the process chamber and then the process chamber is flushed with an inert gas and then the second N precursor gas is introduced into the process chamber and then the process chamber is flushed with an inert gas is carried out p times, where p>1, and wherein a second substep of the third step in which the second Si precursor gas is introduced into the process chamber and then the process chamber is flushed with an inert gas is carried out q times in succession, where q>1.

6. The method according to claim 5, wherein the third step is carried out r times in succession, where r>1.

7. The method according to claim 1, wherein one or more of the first, second and third Ti precursor gases are introduced at a partial pressure of less than $12 \times 10^{-3}$ millibar.

8. The method according to claim 1, wherein one or both of the first and second Si precursor gases Si are introduced at a partial pressure between $1 \times 10^{-3}$ and $4 \times 10^{-3}$ millibar and/or one or both of the first and second N precursor gases are introduced at a partial pressure between $9 \times 10^{-3}$ and $8 \times 10^{-1}$ millibar.

9. The method according to claim 1, wherein the total pressure inside the process chamber during depositing is in the range between 0.6 and 6 millibar, wherein the steps are carried out at the temperature between 400 and 700° C., and wherein the times for introducing the Ti, N and Si precursor gases are in the range between 0.4 and 60 seconds.

10. The method according to claim 1, wherein in each of the steps and substeps thereof, the pressures inside the process chamber are controlled by a throttle valve at a foreline exhaust of the process chamber such that the steps and their substeps thereof are run at same or different chamber pressures from 0.5 mtorr to 7.5 torr.

11. The method according to claim 1, wherein the layer comprises a first interface facing the substrate, a boundary region facing away from the substrate and a core region arranged between the first and second boundary regions, wherein the nitrogen content in the first and second boundary regions is greater than that in the core region.

12. The method according to claim 11, wherein the core region is essentially free of nitrogen.

13. The method according to claim 1, wherein the first, second and third Ti precursor gases are different ones of $TiCl_4$, tetrakis(dimethylamino)titanium and tetrakis(diethylamino)titanium.

14. The method according to claim 1, wherein the first and second Si precursor gases are different ones of $SiH_2Cl_2$, $SiHCl_3$, $SiCl_4$, $SiH_4$ and $Si_2H_6$.

15. The method according to claim 1, wherein the first and second N precursor gases are different ones of $NH_3$ and monomethylhydrazine.

16. The method according to claim 1, wherein each of the first, second and third Ti precursor gases is $TiCl_4$, tetrakis(dimethylamino)titanium or tetrakis(diethylamino)titanium.

17. The method according to claim 1, wherein each of the first and second Si precursor gases is $SiH_2Cl_2$, $SiHCl_3$, $SiCl_4$, $SiH_4$ or $Si_2H_6$.

18. The method according to claim 1, wherein each of the first and second N precursor gases is $NH_3$ or monomethylhydrazine.

19. The method according to claim 1, wherein depositing the TiN sublayer comprises exposing the substrate having the TiSi formed thereon to the third Ti precursor gas and the second N precursor gas, wherein depositing the Si sublayer comprises exposing the TiN sublayer to the second Si precursor gas without exposing the substrate to a N precursor, and wherein a last sublayer of the TiSiN is a Si sublayer that is essentially free of N.

20. The method according to claim 1, wherein depositing the layer comprises depositing on the substrate that is heated to the temperature of 400° C.-700° C. that is sufficient to cause formation of each of the TiN, the TiSi and the TiSiN by decomposition reactions between respective sequentially introduced precursor gases.

* * * * *

UNITED STATES PATENT AND TRADEMARK OFFICE
CERTIFICATE OF CORRECTION

PATENT NO. : 11,401,607 B2
APPLICATION NO. : 15/612853
DATED : August 2, 2022
INVENTOR(S) : Vinayak Veer Vats It is certified that error appears in the above-identified patent and that said Letters Patent is hereby corrected as shown below:

On the Title Page

Item (72) Inventors, Line 3, delete "Bo Seon Choi, Youngin-Si (KR)" and insert -- Bo Seon Choi, Yongin-Si (KR) --.

In the Drawings

Sheet 2 of 2 (Reference Numeral 13) (Fig. 2), Line 1, delete "Contening" and insert -- Containing --.

Sheet 2 of 2 (Reference Numeral 24) (Fig. 2), Line 1, delete "Contening" and insert -- Containing --.

Sheet 2 of 2 (Reference Numeral 25) (Fig. 2), Line 1, delete "Contening" and insert -- Containing --.

In the Specification

Column 8, Line 12, delete "application)." and insert -- application. --.

Column 8, Line 49, delete "29" and insert -- 20 --.

Signed and Sealed this
Twenty-first Day of February, 2023

Katherine Kelly Vidal
*Director of the United States Patent and Trademark Office*